(12) United States Patent
Park et al.

(10) Patent No.: US 10,768,470 B2
(45) Date of Patent: Sep. 8, 2020

(54) COLOR CONVERSION PANEL AND DISPLAY DEVICE INCLUDING THE SAME

(71) Applicant: Samsung Display Co., Ltd., Yongin-si, Gyeonggi-Do (KR)

(72) Inventors: Kyoungwon Park, Seoul (KR); Soodong Kim, Hwaseong-si (KR); Minki Nam, Incheon (KR); Sungwoon Kim, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/185,385

(22) Filed: Nov. 9, 2018

(65) Prior Publication Data
US 2019/0302519 A1    Oct. 3, 2019

(30) Foreign Application Priority Data

Mar. 29, 2018    (KR) .................. 10-2018-0036374

(51) Int. Cl.
*G02B 5/20* (2006.01)
*G02F 2/02* (2006.01)
(Continued)

(52) U.S. Cl.
CPC ....... *G02F 1/133514* (2013.01); *G02B 5/201* (2013.01); *G02F 1/133516* (2013.01);
(Continued)

(58) Field of Classification Search
CPC ................. G02F 1/133514; G02F 2/02; G02F 1/133617; G02B 5/201; H01L 27/332;
(Continued)

(56) References Cited

U.S. PATENT DOCUMENTS 8,692,969 B2    4/2014    Jang et al.
8,749,735 B2    6/2014    Jang et al.
(Continued)

FOREIGN PATENT DOCUMENTS

KR    10-1636052 B1    7/2016
KR    10-1636441 B1    7/2016
(Continued)

*Primary Examiner* — Jessica M Merlin
(74) *Attorney, Agent, or Firm* — Kile Park Reed & Houtteman PLLC (57) ABSTRACT

A color conversion panel includes a color base substrate including a first transmissive area, a second transmissive area and a third transmissive area; a light blocking pattern on the color base substrate and defining the first transmissive area, the second transmissive area, and the third transmissive area; a first color filter in the first transmissive area and the second transmissive area; a first color conversion layer on the first color filter at the first transmissive area; a second color conversion layer on the first color filter in the second transmissive area; and a second color filter on the first transmissive area, the second transmissive area, and the third transmissive area. The first color conversion layer and the second color conversion layer are each between the first color filter and the second color filter.

21 Claims, 9 Drawing Sheets

(51) Int. Cl.
*H01L 27/32* (2006.01)
*G02F 1/1335* (2006.01)

(52) U.S. Cl.
CPC .......... *G02F 1/133553* (2013.01); *G02F 2/02* (2013.01); *H01L 27/322* (2013.01)

(58) Field of Classification Search
CPC ........... H01L 51/502; H01L 2933/0041; H01L 27/322; H01L 1/502; H01L 33/50
See application file for complete search history.

(56) References Cited

U.S. PATENT DOCUMENTS

| | | |
|---|---|---|
| 9,971,076 B2 | 5/2018 | Park et al. |
| 2008/0042552 A1* | 2/2008 | Cok ................. B82Y 20/00 |
| | | 313/501 |
| 2009/0027591 A1* | 1/2009 | Hwang ............... G02B 5/0226 |
| | | 349/64 |
| 2016/0357068 A1* | 12/2016 | Yang ............... G02F 1/133504 |
| 2017/0141162 A1 | 5/2017 | Kim et al. |
| 2017/0242292 A1 | 8/2017 | Jeon et al. |
| 2018/0006093 A1 | 1/2018 | Kim et al. |

FOREIGN PATENT DOCUMENTS

| | | |
|---|---|---|
| KR | 10-2017-0061765 A | 6/2017 |
| KR | 10-2017-0099026 A | 6/2017 |
| KR | 10-2017-0110950 A | 10/2017 |
| KR | 10-1809259 A | 12/2017 |
| KR | 10-2018-0002933 A | 1/2018 |

* cited by examiner

COLOR CONVERSION PANEL AND DISPLAY DEVICE INCLUDING THE SAME

CROSS-REFERENCE TO RELATED APPLICATION

Korean Patent Application No. 10-2018-0036374, filed on Mar. 29, 2018, in the Korean Intellectual Property Office (KIPO), and entitled: "Color Conversion Panel and Display Device Including the Same," is incorporated by reference herein in its entirety.

1. Field

Embodiments relate to a color conversion panel including a color conversion layer and to a display device including the color conversion panel.

2. Description of the Related Art

Organic light emitting diode ("OLED") display devices are self-luminescent display devices that display images by using OLEDs that emit light. Recently, color conversion panels have been investigated as a replacement for a conventionally used color filter.

SUMMARY

According to an embodiment, a color conversion panel includes: a color base substrate including a first transmissive area, a second transmissive area and a third transmissive area; a light blocking pattern on the color base substrate and defining the first transmissive area, the second transmissive area, and the third transmissive area; a first color filter in the first transmissive area and the second transmissive area; a first color conversion layer on the first color filter at the first transmissive area; a second color conversion layer on the first color filter at the second transmissive area; and a second color filter in the first transmissive area, the second transmissive area, and the third transmissive area. The first color conversion layer and the second color conversion layer are between the first color filter and the second color filter.

The first color filter may include a yellow dye and a gray dye.

The second color filter may be over the entire surface of the color base substrate.

A height of the second color filter may be different at each of the first transmissive area, the second transmissive area, and the third transmissive area.

The second color filter may have a greater height in the first transmissive area and the second transmissive area than the height in the third transmissive area.

The second color filter may have substantially the same height in the first transmissive area, the second transmissive area, and the third transmissive area.

The color conversion panel may further include a transmissive layer on the second color filter.

The transmissive layer may include a scattering element.

A thickness of the transmissive layer may be different at each of the first transmissive area, the second transmissive area, and the third transmissive area.

The transmissive layer may have a less thickness in the first transmissive area and the second transmissive area than the thickness in the third transmissive area.

The transmissive layer may have substantially the same thickness in the first transmissive area, the second transmissive area, and the third transmissive area.

The color conversion panel may further include a yellow light absorbing layer on a surface of the color base substrate.

The yellow light absorbing layer may be disposed between the color base substrate and the second color filter.

The first color filter may include a yellow light absorbing material.

The second color filter may be a blue color filter.

The first color conversion layer may include red quantum dots or red quantum rods, and the second color conversion layer may include green quantum dots or green quantum rods.

According to an embodiment, a display device includes: a display panel including a plurality of pixels; and a color conversion panel including a first transmissive area, a second transmissive area and a third transmissive area. The color conversion panel includes: a color base substrate; a light blocking pattern on the color base substrate and defining the first transmissive area, the second transmissive area, and the third transmissive area; a first color filter in the first transmissive area and the second transmissive area; a first color conversion layer on the first color filter at the first transmissive area; a second color conversion layer on the first color filter at the second transmissive area; and a second color filter in the first transmissive area, the second transmissive area, and the third transmissive area. The display panel includes an organic light emitting element including a first electrode, an organic light emitting layer, and a second electrode, the first color conversion layer and the second color conversion layer are disposed between the first color filter and the second color filter, and each of the first color conversion layer and the second color conversion layer overlaps the first electrode the organic light emitting layer, and the second electrode.

The first color filter may include a yellow dye and a gray dye.

The second color filter may be disposed over the entire surface of the color base substrate.

The display device may further include a transmissive layer on the second color filter.

The transmissive layer may include a scattering element.

The display device may further include a yellow light absorbing layer on a surface of the color base substrate.

The yellow light absorbing layer may be disposed between the color base substrate and the second color filter.

The first color filter may include a yellow light absorbing material.

The second color filter may be a blue color filter.

The first color conversion layer may include red quantum dots or red quantum rods, and the second color conversion layer may include green quantum dots or green quantum rods.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe embodiments of the present invention and like reference numerals refer to like elements throughout the specification.

Hereinafter, a color conversion panel according to an embodiment will be described.

Figure 1:
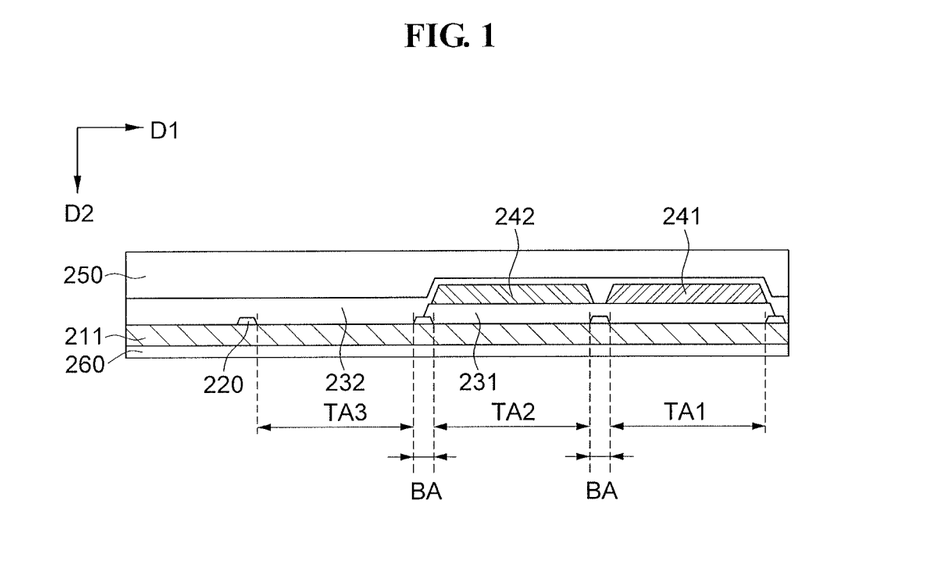
FIG. 1 illustrates a cross-sectional view of a color conversion panel according to an embodiment.

FIG. 1 is a cross-sectional view illustrating a color conversion panel according to an embodiment. Referring to FIG. 1, a color conversion panel according to an embodiment includes a color base substrate 211, a light blocking pattern 220, a first color filter 231, a first color conversion layer 241, a second color conversion layer 242, a second color filter 232, a transmissive layer 250, and a yellow light absorbing layer 260.

The color base substrate 211 may include an insulating material, e.g., glass, plastic, quartz, or the like. The color base substrate 211 may include a material selected from materials having excellent mechanical strength, thermal stability, transparency, surface smoothness, ease of handling, and water resistance.

The color base substrate 211 includes light blocking areas BA at which the light blocking pattern 220 is disposed, and first, second, and third transmissive areas TA1, TA2, and TA3 defined by the light blocking areas BA spaced apart along a first direction D1. For example, each of the first, second, and third transmissive areas TA1, TA2, and TA3 may be defined as an area enclosed by adjacent ones of the light blocking pattern 220. In such an embodiment, each of the first, second, and third transmissive areas TA1, TA2, and TA3 may correspond to one pixel to be described below.

The first, second, and third transmissive areas TA1, TA2, and TA3 may have areas different from each other on a plane. For example, the first and second transmissive areas TA1 and TA2 may have an area larger than an area of the third transmissive area TA3 on a plane. Accordingly, although respective transmissivities of the first color filter 231, the first color conversion layer 241, the second color conversion layer 242, and the second color filter 232 in corresponding ones of the first, second, and third transmissive areas TA1, TA2, and TA3 are different from each other, since the respective areas of the first, second, and third transmissive areas TA1, TA2, and TA3 are different from each other, respective transmittances of the first, second, and third transmissive areas TA1, TA2, and TA3 may be uniform.

The light blocking pattern 220 blocks light emitted from the organic light emitting diode ("OLED") to be described below. The light blocking pattern 220 may define the light blocking areas BA and the first, second, and third transmissive areas TA1, TA2, and TA3.

The light blocking pattern 220 may include a non-photosensitive organic material. In such an embodiment, the light blocking pattern 220 may include a material soluble in a developer. Alternatively, the light blocking pattern 220 may include a photosensitive organic material.

The light blocking pattern 220 may overlap the second color filter 232 and the transmissive layer 250 along a second direction D2, e.g., the second color filter 232 and the transmissive layer 250 may extend along the first direction D1 such that they overlap an entirety of the light blocking pattern 220 along the second direction D2. Portions of the light blocking pattern 220 may overlap at least part of the first color filter 231, the first color conversion layer 241, the second color conversion layer 242, and the yellow light absorbing layer 260. The yellow light absorbing layer 260 may extend along the first direction D1 such that it overlaps an entirety of the light blocking pattern 220 along the second direction D2.

The first color filter 231 may be on the color base substrate 211 including the light blocking pattern 220. Specifically, the first color filter 231 may be on the color base substrate 211 including the light blocking pattern 220 at the first transmissive area TA1 and the second transmissive area TA2. In such an embodiment, the first color filter 231 may overlap at least part of the light blocking pattern 220. For example, the first color filter 231 may extend along the first direction D1 such that it overlaps a blocking area BA between the first transmissive area TA1 and the second transmissive area TA2 along the second direction D2, and a portion of each of blocking area further defining the first transmissive area TA1 and the second transmissive area TA2 along the second direction D2.

According to an embodiment, the first color filter 231 may include an organic material and may include a yellow dye and a gray dye. Specifically, the first color filter 231 may include a yellow dye and a gray dye. The first color filter 231 may have a transmittance ranging from about 30% to about 90% with respect to light having a wavelength ranging from about 500 nm to about 700 nm. In such an embodiment, the gray dye of the first color filter 231 may be present in the amount ranging from about 1 wt % to about 20 wt %. Alternatively, the first color filter 231 may include a yellow light absorbing material, which may allow the yellow light absorbing layer 260 to be described below to be omitted.

The first color conversion layer 241 and the second color conversion layer 242 may be on the first color filter 231. Specifically, the first color conversion layer 241 and the second color conversion layer 242 are between the first color filter 231 and the second color filter 232 to be described below. In particular, the first color conversion layer 241 is on the first color filter 231 at the first transmissive area TA1 and the second color conversion layer 242 is on the first color filter 231 at the second transmissive area TA2. In such an embodiment, the first color conversion layer 241 and the second color conversion layer 242 may be spaced apart from each other along the first direction D1.

Each of the first color conversion layer 241 and the second color conversion layer 242 includes wavelength converting particles. According to an embodiment, the first color conversion layer 241 may include wavelength converting particles in the amount ranging from about 2 wt % to about 15 wt %, and the second color conversion layer 242 may include wavelength converting particles in the amount ranging from about 2 wt % to about 15 wt %. The first color conversion layer 241 and the second color conversion layer 242 may include different weight percentages of the wavelength converting particles.

The wavelength converting particle may include a quantum dot particle. The quantum dot particle converts a wavelength of light to emit light of a specific wavelength. The wavelength of light emitted from the first color conversion layer 241 and the second color conversion layer 242 varies depending on the size of the quantum dot particles. In other words, light having different wavelengths is emitted from the first color conversion layer 241 and the second color conversion layer 242 in accordance with the diameter of the quantum dots.

The quantum dot particle may have a diameter of about 2 nm or more and about 10 nm or less. In general, when the quantum dot particle has a small diameter, the wavelength of the output light is shortened and light at the blue end of the spectrum is output. When the diameter of the quantum dot particle increases, the wavelength of the output light is lengthened and light at the red end of the spectrum is output. For example, a quantum dot particle having a diameter of about 10 nm may output red light, a quantum dot particle having a diameter of about 7 nm may output green light, and a quantum dot particle having a diameter of about 5 nm may output blue light.

Since the quantum dot particle has a high quantum yield and a high extinction coefficient as compared to those of general fluorescent dyes, significantly more intense light may be generated. In particular, the quantum dot particle may absorb a light of a short wavelength to output a light of a longer wavelength.

The quantum dot particle may have a structure including a core nanocrystal and a shell nanocrystal surrounding the core nanocrystals. In addition, the quantum dot particle may include an organic ligand bonded to the shell nanocrystal and may further include an organic coating layer surrounding the shell nanocrystal. The shell nanocrystal may have two or more layers. The shell nanocrystal may cover a surface of the core nanocrystal.

The quantum dot particle may include at least one substance of group II compound semiconductors, group III compound semiconductors, group V compound semiconductors and group VI compound semiconductors. For example, the core nanocrystal forming the quantum dot particle may include at least one of: PbSe, InAs, PbS, CdSe, InGaP, CdTe, CdS, ZnSe, ZnTe, ZnS, HgTe, HgS, or the like. In addition, the shell nanocrystal may include at least one of: CuZnS, CdSe, CdTe, CdS, ZnSe, ZnTe, ZnS, HgTe, HgS, or the like.

For example, when the core nanocrystal includes CdSe, blue light may be emitted when the diameter of the quantum dot particle ranges from about 1 nm to about 3 nm, green light may be emitted when the diameter of the quantum dot particle ranges from about 3 nm to about 5 nm, and red light may be emitted when the diameter of the quantum dot particle ranges from about 7 nm to about 10 nm.

The quantum dot particle may be formed by a wet-chemical method. The wet-chemical method is a method of growing particles by adding a precursor material to an organic solvent.

Alternatively, the first color conversion layer 241 and/or the second color conversion layer 242 may include quantum rod particles instead of the quantum dot particles described above.

The first color conversion layer 241 converts blue light incident thereon from the OLED to emit red light and the second color conversion layer 242 converts blue light incident therein from the OLED to emit green light. For example, the first color conversion layer 241 includes red wavelength converting particles to convert the blue light incident thereon from the OLED into red light. The red light may have a wavelength ranging from about 620 nm to about 750 nm. In addition, the second color conversion layer 242 includes green wavelength converting particles to convert the blue light incident thereon from the OLED into green light. The green light may have a wavelength ranging from about 495 nm to about 570 nm. Accordingly, the first transmissive area TA1 at which the first color conversion layer 241 is disposed may correspond to a red pixel to be described below and the second transmissive area TA2 at which the second color conversion layer 242 is disposed may correspond to a green pixel to be described below.

The first color conversion layer 241 and the second color conversion layer 242 may have substantially the same thickness along the second direction D2. Alternatively, thicknesses of the first color conversion layer 241 and the second color conversion layer 242 may be different according to the transmittances of the first color conversion layer 241 and the second color conversion layer 242, respectively.

The second color filter 232 is on the color base substrate 211 including the light blocking pattern 220, the first color filter 231, the first color conversion layer 241 and the second color conversion layer 242. Specifically, the second color filter 232 is on the color base substrate 211 including the light blocking pattern 220, the first color filter 231, the first color conversion layer 241 and the second color conversion layer 242 at the first transmissive area TA1, the second transmissive area TA2, and the third transmissive area TA3. In such an embodiment, the second color filter 232 extends along the first direction D1 over the entire surface of the color base substrate 211 including the light blocking pattern 220, the first color filter 231, the first color conversion layer 241 and the second color conversion layer 242. Accordingly, the second color filter 232 overlaps, e.g., completely overlaps, the light blocking pattern 220 along the second direction D2.

When a height of the second color filter 232 is defined as the height from the color base substrate 211 to an upper surface of the second color filter 232 along the second direction D2, the second color filter 232 may have a height that differs at each of the first transmissive area TA1, the second transmissive area TA2, and the third transmissive area TA3. Specifically, as illustrated in FIG. 1, the second color filter 232 has a higher in the first transmissive area TA1 and the second transmissive area TA2 than in the third transmissive area TA3.

The second color filter 232 may include an organic material and a blue dye. In other words, the second color filter 232 is a blue color filter.

The transmissive layer 250 may include a transparent material through which light may be transmitted. The transmissive layer 250 does not include wavelength converting particles. The wavelength of light passing through the transmissive layer 250 does not change. Specifically, the transmissive layer 250 does not change the wavelength of the light incident from the OLED.

When a thickness of the transmissive layer 250 along the second direction D2 is defined as the height from a lower surface of the transmissive layer 250 to an upper surface of the transmissive layer 250, the transmissive layer 250 may have a thickness that differs at each of the first transmissive area TA1, the second transmissive area TA2, and the third transmissive area TA3. Specifically, as illustrated in FIG. 1, the transmissive layer 250 may be thinner in the first transmissive area TA1 and the second transmissive area TA2 than in the third transmissive area TA3, e.g., such that an upper surface thereof is substantially planar.

The transmissive layer 250 may include a scattering element so that light incident from the OLED may be scattered. For example, the transmissive layer 250 may include at least one of: silica, titanium oxide ($TiO_2$), zirconium oxide ($ZrO_2$), acrylic beads, styrene-acrylic beads, melamine beads, polystyrene, polymethyl methacrylate (PMMA), polyurethane, polycarbonate beads, polyvinyl chloride beads, silicone-based particles, or the like.

According to an embodiment, when a surface of the color base substrate 211 on which the light blocking pattern 220, the first color filter 231, the first color conversion layer 241, the second color conversion layer 242, the second color filter 232, and the transmissive layer 250 are formed is defined as an upper surface and a surface of the color base substrate 211 opposing the upper surface of the color base substrate 211 is defined as a lower surface, the yellow light absorbing layer 260 may be on the lower surface of the color base substrate 211. Referring to FIG. 1, the yellow light absorbing layer 260 extend along the first direction D1 over the entire lower surface of the color base substrate 211, such that the yellow light absorbing layer 260 overlaps the first, second, and third transmissive areas TA1, TA2, and TA3 along the second direction D2. Alternatively, the yellow light absorbing layer 260 may overlap the first transmissive area TA1 and the second transmissive area TA2, but not the third transmissive area TA3.

The yellow light absorbing layer 260 may include a yellow light absorbing material. The yellow light absorbing material absorbs yellow light having a wavelength ranging from about 500 nm to about 800 nm of the light having passed through the first color filter 231. Accordingly, the yellow light absorbing layer 260 may reduce the transmittance of the reflected yellow light of the external light and substantially prevent the reflected light of the external light from being yellowish, thereby realizing a neutral black. A polarizing layer may be on the color conversion panel to further reduce reflection of external light.

Hereinafter, a process of manufacturing a color conversion panel according to an embodiment will be described in detail with reference to FIGS. 2 to 9. FIGS. 2 to 9 illustrate stages in a process of manufacturing a color conversion panel according to an embodiment.

Figure 2:
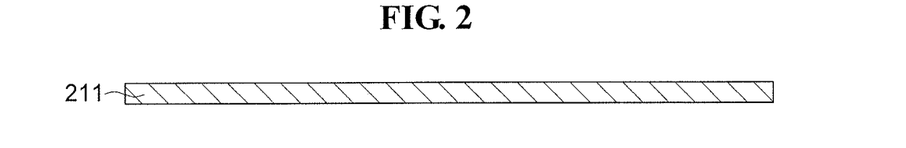
FIGS. 2 to 9 illustrate views of stages in a process of manufacturing a color conversion panel according to an embodiment.

Referring to FIG. 2, the color base substrate 211 is prepared.

Figure 3:
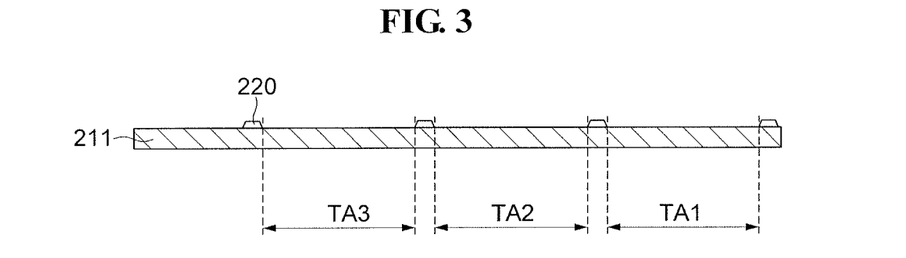

Referring to FIG. 3, the light blocking pattern 220 is on the color base substrate 211. The light blocking pattern 220 may be formed by patterning a layer through a photolithography process. For example, a light blocking layer may be coated on the color base substrate 211, exposed through a mask, and developed to form the light blocking pattern 220. Alternatively, the light blocking pattern 220 may be formed by different patterning process. e.g., imprinting, selective deposition, or the like. As such, the first transmissive area TA1, the second transmissive area TA2 and the third transmissive area TA3 are defined by the light blocking pattern 220 as described above.

Figure 4:
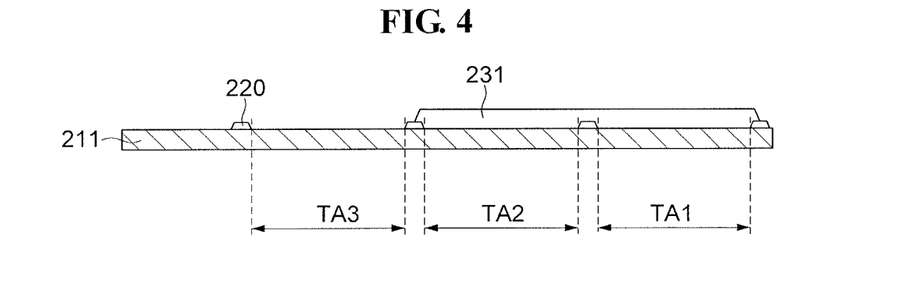

Referring to FIG. 4, the first color filter 231 is formed on the color base substrate 211 including the light blocking pattern 220 at the first transmissive area TA1 and the second transmissive area TA2. The first color filter 231 may be formed by patterning through a photolithography process. For example, a material forming the first color filter 231 is coated on the color base substrate 211 including the light blocking pattern 220, exposed through a mask, and developed to form the first color filter 231. Alternatively, the first color filter 231 may be formed through a different patterning process, e.g., imprinting, selective deposition, or the like.

Figure 5:
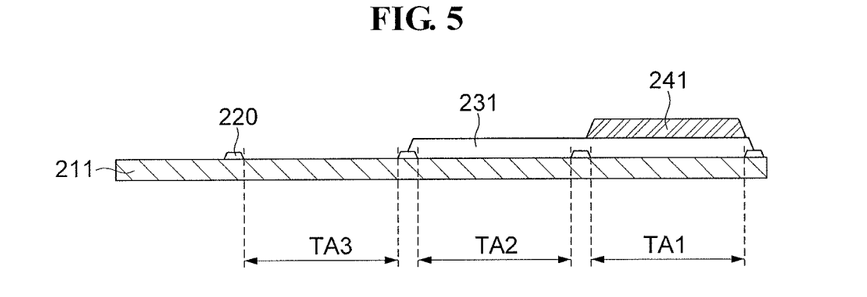

Referring to FIG. 5, the first color conversion layer 241 is formed on the first color filter 231 at the first transmissive area TA1. The first color conversion layer 241 is formed by patterning through a photolithography process. For example, a material forming the first color conversion layer 241 is coated on the color base substrate 211 including the light blocking pattern 220 and the first color filter 231, exposed through a mask, and developed to form the first color conversion layer 241. Alternatively, the first color conversion layer 241 may be formed through a different patterning process, e.g., imprinting, selective deposition, or the like.

Figure 6:
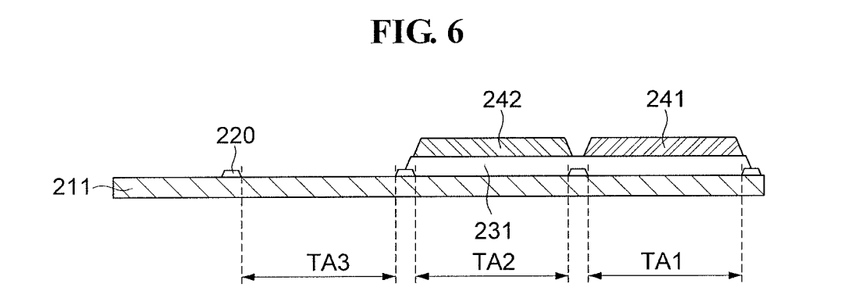

Referring to FIG. 6, the second color conversion layer 242 is formed on the first color filter 231 at the second transmissive area TA2. In such an embodiment, the second color conversion layer 242 may be spaced apart from the first color conversion layer 241 along the first direction D1. The second color conversion layer 242 may be formed by patterning through a photolithography process. For example, a material forming the second color conversion layer 242 is coated on the color base substrate 211 including the light blocking pattern 220 and the first color filter 231, exposed through a mask, and developed to form the second color conversion layer 242. Alternatively, the second color conversion layer 242 may be formed through a different patterning process, e.g., imprinting, selective deposition, or the like.

Figure 7:
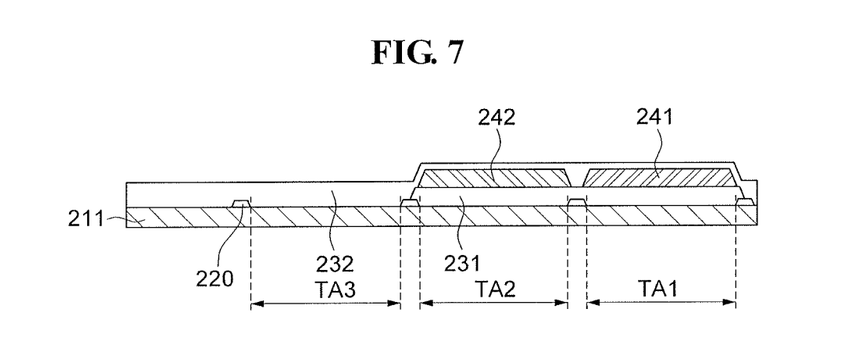

Referring to FIG. 7, a material forming the second color filter 232 is coated on the color base substrate 211 including the light blocking pattern 220, the first color filter 231, the first color conversion layer 241 and the second color conversion layer 242 to form the second color filter 232. The material forming the second color filter 232 may be coated over the entire surface of the color base substrate 211 including the light blocking pattern 220, the first color filter 231, the first color conversion layer 241, and the second color conversion layer 242. Accordingly, a separate process, e.g., a photolithography process, may be omitted, which may reduce the manufacturing costs.

The second color filters 232 may be formed at different heights in each of the first, second, and third transmissive areas TA1, TA2, and TA3. Specifically, as illustrated in FIG. 7, the second color filter 232 may be formed having a greater height in the first transmissive area TA1 and the second transmissive area TA2 than the height in the third transmissive area TA3.

Figure 8:
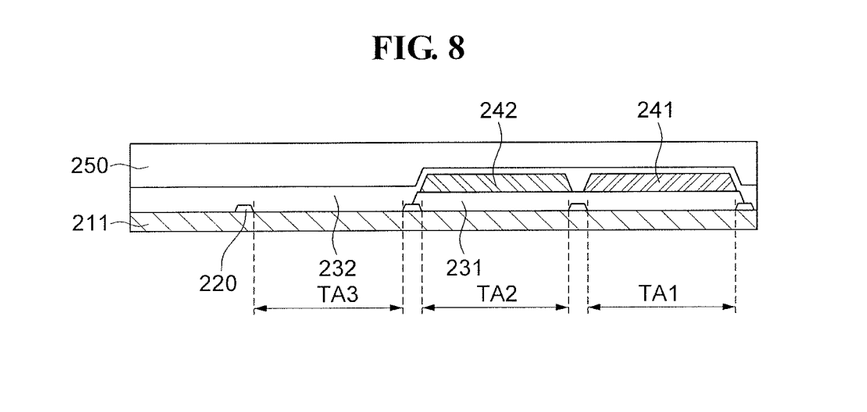

Referring to FIG. 8, the transmissive layer 250 may be formed on the color base substrate 211 including the light blocking pattern 220, the first color filter 231, the first color conversion layer 241, the second color conversion layer 242, and the second color filter 232. The transmissive layer 250 may be coated over the entire surface of the color base substrate 211 including the light blocking pattern 220, the first color filter 231, the first color conversion layer 241, the second color conversion layer 242, and the second color filter 232.

Figure 9:
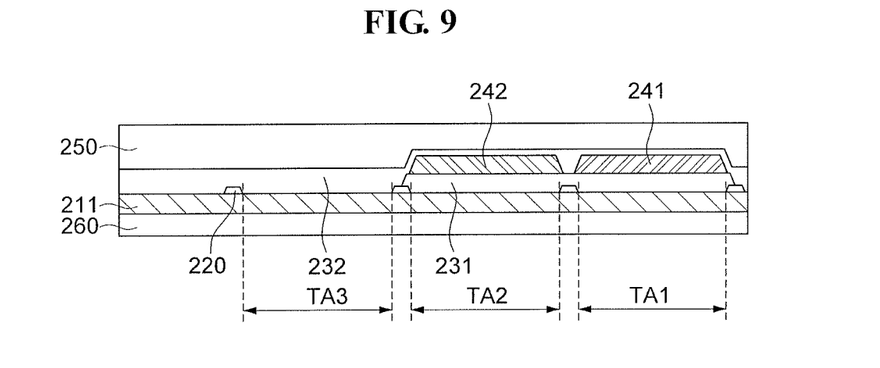

Referring to FIG. 9, the yellow light absorbing layer 260 is formed on the lower surface of the color base substrate 211. The yellow light absorbing layer 260 may be provided over the entire lower surface of the color base substrate 211. Alternatively, the yellow light absorbing layer 260 may be formed on a surface of the color base substrate 211 before the light blocking pattern 220, the first color filter 231, the first color conversion layer 241, the second color conversion layer 242, the second color filter 232, and the transmissive layer 250 are formed, or at any stage thereof.

Hereinafter, a color conversion panel according to another embodiment will be described in detail with reference to FIG. 10. The description of the color conversion panel according to an embodiment will be omitted from the description related to the color conversion panel according to another embodiment.

Figure 10:
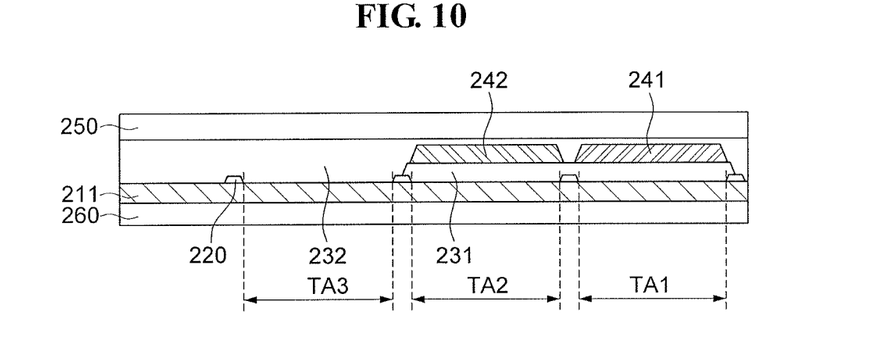
FIG. 10 illustrates a cross-sectional view of a color conversion panel according to another embodiment.

FIG. 10 is a cross-sectional view illustrating a color conversion panel according to another embodiment. As shown therein, the second color filter 232 may have substantially the same height at the first, second, and third transmissive areas TA1, TA2, and TA3. Specifically, the second color filter 232 may have substantially the same height from the upper surface of the color base substrate 211 to an upper surface of the second color filter 232, e.g., the second color filter 232 may have a substantially planar upper surface.

The transmissive layer 250 of the color conversion panel according to another embodiment of may have substantially the same thickness at the first, second, and third transmissive areas TA1, TA2, and TA3. Since the transmissive layer 250 including scattering elements has a uniform thickness at the first, second, and third transmissive areas TA1, TA2, and TA3, the scattering elements may be uniformly distributed in the first, second, and third transmissive areas TA1, TA2, and TA3.

Figure 11:
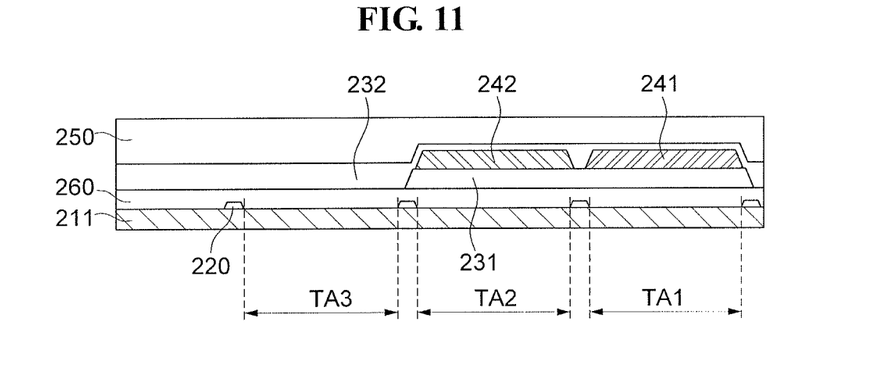
FIG. 11 illustrates a cross-sectional view of a color conversion panel according to still another embodiment.

Hereinafter, a color conversion panel according to still another embodiment will be described in detail with reference to FIG. 11. FIG. 11 is a cross-sectional view illustrating a color conversion panel according to still another embodiment.

According to still another embodiment, the yellow light absorbing layer 260 is between the color base substrate 211 and the second color filter 232. Specifically, the yellow light absorbing layer 260 may be between the color base substrate 211, including the light blocking pattern 220, and the first color filter 231 and between the color base substrate 211 and the second color filter 232. That is, the yellow light absorbing layer 260 according to still another embodiment is on the upper surface of the color base substrate 211.

Referring to FIG. 11, the yellow light absorbing layer 260 may be extend along the first direction D1 over the entire upper surface of the color base substrate 211, such that the yellow light absorbing layer 260 is on at the first, second, and third transmissive areas TA1, TA2, and TA3. Alternatively, the yellow light absorbing layer 260 may extend only on the first transmissive area TA1 and the second transmissive area TA2, but not on the third transmissive area TA3.

Hereinafter, stages in a process of manufacturing the color conversion panel according to still another embodiment will be described in detail with reference to FIGS. 12 to 18. The description of the process of manufacturing the color conversion panel according to an embodiment will be omitted from the description of the process of manufacturing the color conversion panel according to still another embodiment and another embodiment. FIGS. 12 to 18 are views illustrating stages in a process of manufacturing a color conversion panel according to still another embodiment.

Figure 12:
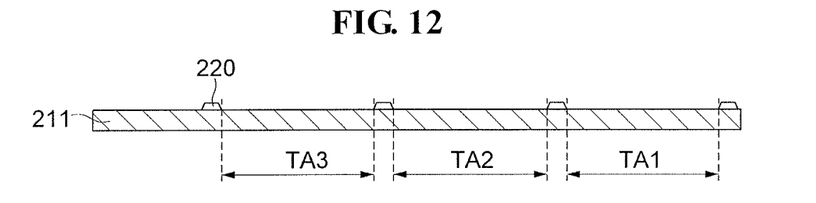
FIGS. 12 to 18 illustrate views of stages in a process of manufacturing a color conversion panel according to still another embodiment.

Referring to FIG. 12, the light blocking pattern 220 is formed on the color base substrate 211. The light blocking pattern 220 may formed by any of the methods noted above with reference to FIG. 3.

Figure 13:
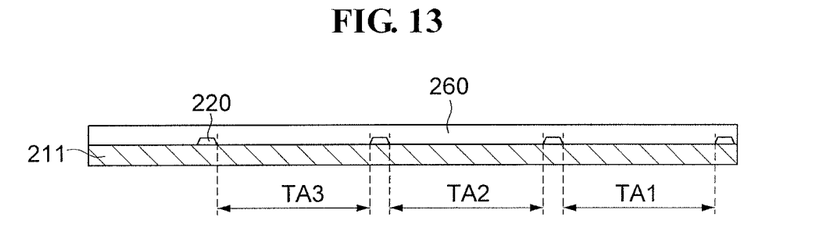

Referring to FIG. 13, the yellow light absorbing layer 260 may be formed on the color base substrate 211 including the light blocking pattern 220. The yellow light absorbing layer 260 according to still another embodiment may be formed over the entire upper surface of the color base substrate 211 including the light blocking pattern 220. That is, the yellow light absorbing layer 260 may be formed at the first, second, and third transmissive areas TA1, TA2, and TA3. Alternatively, the yellow light absorbing layer 260 may be formed on the first transmissive area TA1 and the second transmissive area TA2, but not on the third transmissive area TA3.

Figure 14:
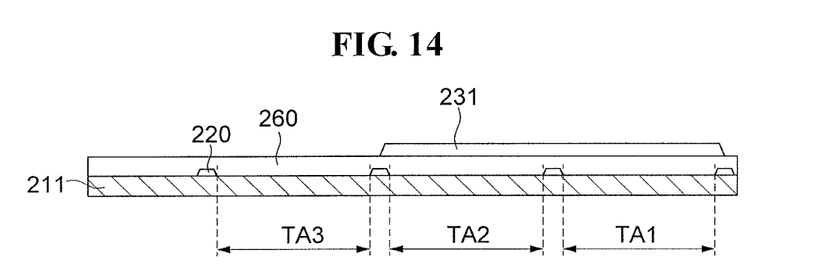

Referring to FIG. 14, the first color filter 231 is formed on the color base substrate 211 including the light blocking pattern 220 and the yellow light absorbing layer 260 at the first transmissive area TA1 and the second transmissive area TA2. The first color filter 231 may be formed by any of the methods noted above with reference to FIG. 4.

Figure 15:
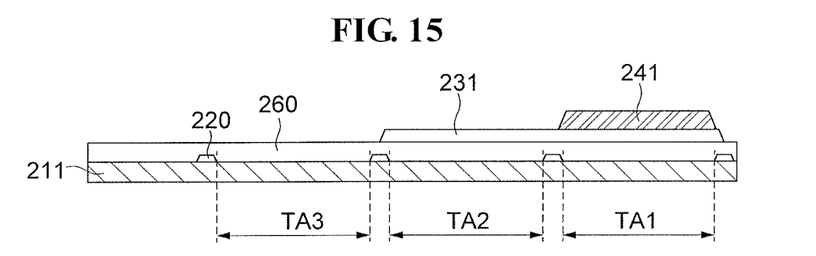

Referring to FIG. 15, the first color conversion layer 241 is formed on the first color filter 231 at the first transmissive area TA1. The first color conversion layer 241 may be formed by any of the methods noted above with reference to FIG. 5.

Figure 16:
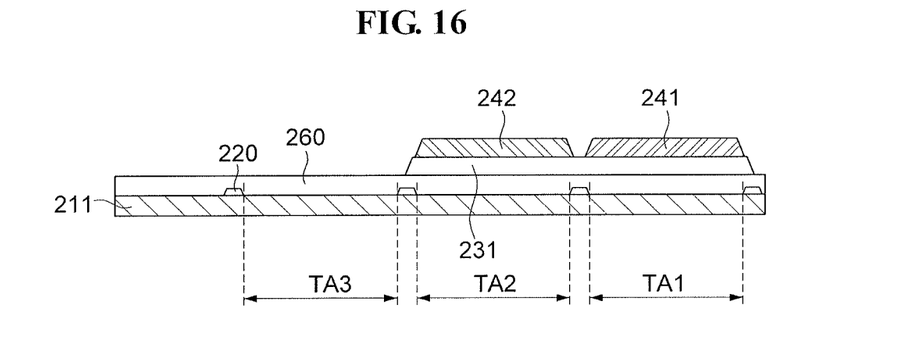

Referring to FIG. 16, the second color conversion layer 242 is formed on the first color filter 231 at the second transmissive area TA2. The second color conversion layer 242 may be spaced apart from the first color conversion layer 241 along the first direction D1. The second color conversion layer 242 may be formed by any of the methods noted above with reference to FIG. 6.

Figure 17:
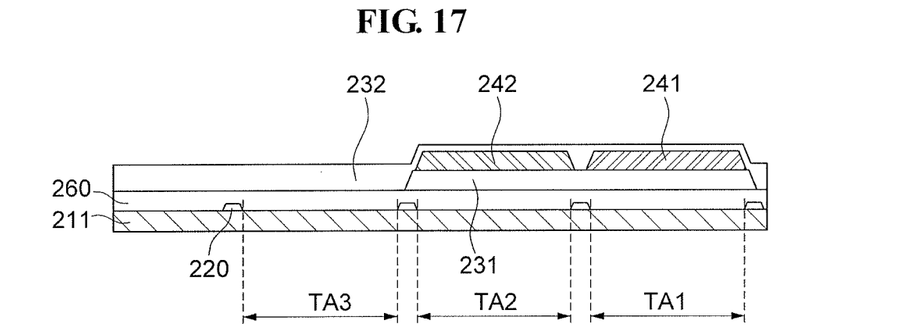

Referring to FIG. 17, a material forming the second color filter 232 may be provided on the color base substrate 211 including the light blocking pattern 220, the first color filter 231, the first color conversion layer 241, the second color conversion layer 242, and the yellow light absorbing layer 260 to form the second color filter 232. The material forming the second color filter 232 may be provided over the entire surface of the color base substrate 211 including the light blocking pattern 220, the first color filter 231, the first color conversion layer 241, the second color conversion layer 242, and the yellow light absorbing layer 260. Accordingly, a separate process, e.g., a photolithography process, may be omitted, which may reduce the manufacturing costs.

The second color filters 232 may be formed at different heights in the first, second, and third transmissive areas TA1, TA2, and TA3. Specifically, as illustrated in FIG. 17, the second color filter 232 may be higher in the first transmissive area TA1 and the second transmissive area TA2 than in the third transmissive area TA3.

Figure 18:
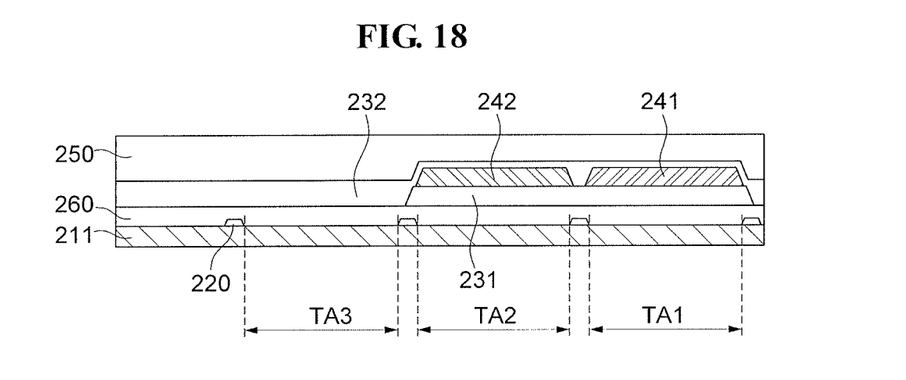

Referring to FIG. 18, the transmissive layer 250 may be formed on the color base substrate 211 including the light blocking pattern 220, the yellow light absorbing layer 260, the first color filter 231, the first color conversion layer 241, the second color conversion layer 242, and the second color filter 232. In such an embodiment, the transmissive layer 250 may be a resin including a scattering element.

Hereinafter, a display device according to an embodiment will be described with reference to FIGS. 19 to 22.

Figure 19:
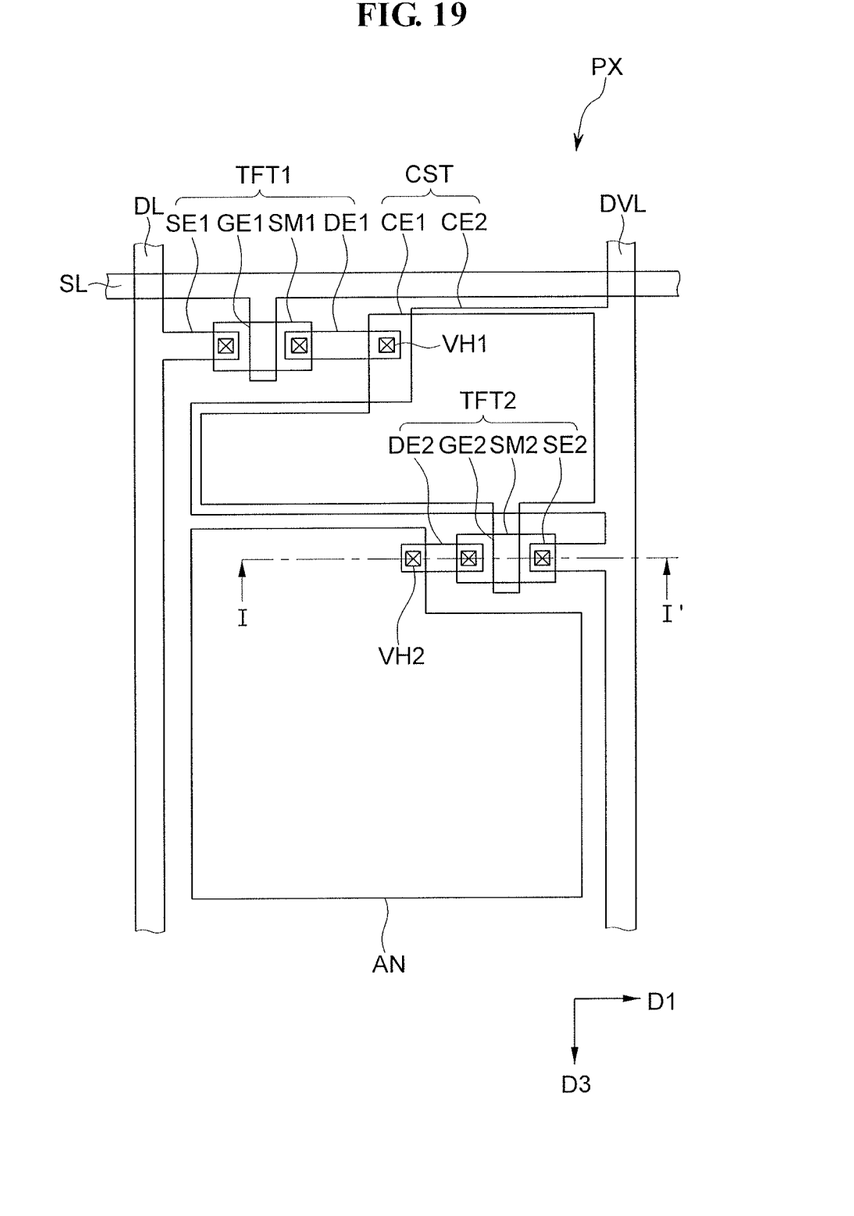
FIG. 19 illustrates a plan view of one pixel according to an embodiment.
Figure 20:
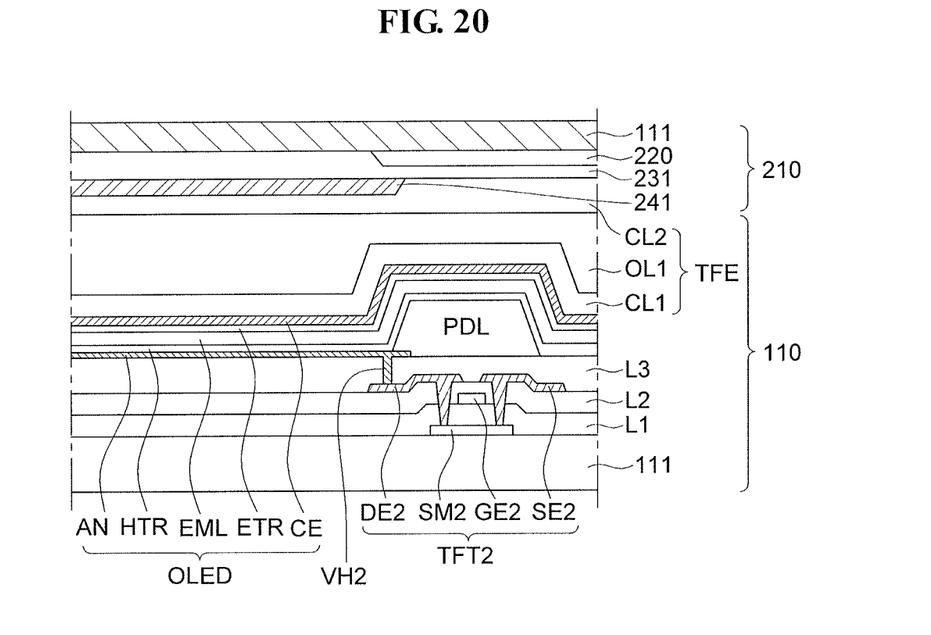
FIG. 20 illustrates a cross-sectional view taken along line I-I' of FIG. 19.

FIG. 19 is a plan view illustrating one pixel according to an embodiment, and FIG. 20 is a cross-sectional view taken along line I-I' of FIG. 19. Referring to FIGS. 19 and 20, the display device according to an embodiment includes a display panel 110 and a color conversion panel 210.

The display panel 110 includes a gate line SL, a data line DL, a power signal line DVL, a switching transistor TFT1, a driving transistor TFT2, a storage capacitor CST, and an OLED.

The gate line SL is on a display base substrate 111 to transmit a gate signal. The data line DL is insulated from the gate line SL and is on the display base substrate 111 to transmit a data signal. The gate line SL may extend in the first direction D1, and the data line DL may extend in a third direction D3 that intersects the first direction D1 and the second direction D2.

The switching transistor TFT1 is electrically connected to the gate line SL and the data line DL. The switching transistor TFT1 receives the gate signal through the gate line SL and receives the data signal through the data line DL.

The switching transistor TFT1 includes a first semiconductor layer SM1, a first gate electrode GE1, a first source electrode SE1, and a first drain electrode DE1. The first semiconductor layer SM1 may include a semiconductor material. The first semiconductor layer SM1 may include polycrystalline silicon. Alternatively, the first semiconductor layer SM1 may include an oxide semiconductor, e.g., IGZO, ZnO, $SnO_2$, $In_2O_3$, $Zn_2SnO_4$, $Ge_2O$, $HfO_2$, or the like. Further alternatively, the first semiconductor layer SM1 may include a compound semiconductor, e.g., GsAs, GaP, InP, or the like, or amorphous silicon.

The first gate electrode GE1 is connected to the gate line SL and overlaps the first semiconductor layer SM1 along the second direction D2. In addition, the first source electrode SE1 is connected to the data line DL to contact a source area of the first semiconductor layer SM1, and the first drain electrode DE1 contacts a drain area of the first semiconductor layer SM1 to be connected to the storage capacitor CST.

The storage capacitor CST includes a first storage electrode CE1 and a second storage electrode CE2. The first and second storage electrodes CE1 and CE2 overlap each other along the second direction D2. The first storage electrode CE1 is connected to the first drain electrode DE1 through a first via hole VH1. In addition, at least one of a gate insulating layer L1 and an intermediate insulating layer L2 may be between the first and second storage electrodes CE1 and CE2.

The first storage electrode CE1 is connected to the first drain electrode DE1 and the second storage electrode CE2 is connected to the power signal line DVL. Accordingly, the storage capacitor CST stores electric charges corresponding to a difference between a voltage corresponding to the data signal received from the switching transistor TFT1 and a voltage corresponding to the power signal received from the power signal line DVL, and the electric charges may be delivered to the driving transistor TFT2 while the switching transistor TFT1 is turned off.

The driving transistor TFT2 is connected to the switching transistor TFT1, the power signal line DVL and the OLED. The driving transistor TFT2 switches the power signal applied from the power signal line DVL to the OLED.

The driving transistor TFT2 includes a second semiconductor layer SM2, a second gate electrode GE2, a second source electrode SE2, and a second drain electrode DE2. The second gate electrode GE2 is connected to the first drain electrode DE1 through the first storage electrode CE1, and the second source electrode SE2 is connected to the power signal line DVL. In addition, the second drain electrode DE2 is connected to the OLED through a second via hole VH2 in a cover insulating layer L3.

The gate insulating layer L1 covers the second semiconductor layer SM2, and the intermediate insulating layer L2 is on the gate insulating layer L1 to cover the second gate electrode GE2. The cover insulating layer L3 is on the intermediate insulating layer L2 to cover the second source electrode SE2 and the second drain electrode DE2. In other words, the gate insulating layer L1, the intermediate insulating layer L2, and the cover insulating layer L3 may be stacked along the second direction D2 to cover constituent elements of the TFT2.

The OLED emits light in response to the power signal provided through the driving transistor TFT2. The OLED includes a first electrode AN, a hole control layer HTR, an organic light emitting layer EML, an electron control layer ETR, and a second electrode CE.

The first electrode AN is on the cover insulating layer L3 and is connected to the second drain electrode DE2 through the second via hole VH2 defined through the cover insulating layer L3. The first electrode AN may be a reflective electrode. In such an embodiment, the first electrode AN may be a metal layer that includes a metal, e.g., Ag, Mg, Al, Pt, Pd, Au, Ni, Nd, Ir, Cr, or the like. In addition, the first electrode AN may further include a metal oxide layer stacked on the metal layer. For example, the first electrode AN may have a two-layer structure, e.g., ITO/Mg, ITO/MgF, or the like, or a multilayer structure, e.g., ITO/Ag/ITO or the like.

A pixel defining layer PDL is on the first electrode AN. An opening is defined by the pixel defining layer PDL, and the organic light emitting layer EML may contact the first electrode AN through the opening of the pixel defining layer PDL. The pixel defining layer PDL defines a pixel, which will be described below, of the display device according to an embodiment. Specifically, the pixel is an area in which the first electrode AN, the organic light emitting layer EML, and the second electrode CE overlap each other along the second direction in the opening defined by the pixel defining layer PDL.

The hole control layer HTR may include a hole injecting layer and a hole transporting layer. In addition, the hole control layer HTR may further include at least one of a hole buffer layer and an electron blocking layer.

The hole injecting layer may include a hole injecting material, and the hole injecting material may include, e.g., a phthalocyanine compound, such as copper phthalocyanine, N,N'-diphenyl-N,N-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), (polyaniline)/poly(4-styrenesulfonate) (PANI/PSS), or the like.

The hole injecting layer may further include a charge generating material for improving conductivity of the hole transporting layer HTR. The charge generating material may be a p-type dopant, e.g., one of a quinone derivative, a metal oxide, and a compound including a cyano group, or the like. For example, according to another embodiment, examples of the p-type dopant may include a quinone derivative, e.g., tetracyanoquinodimethane (TCNQ), 2,3,5,6-tetrafluoro-tetracyanoquinodimethane (F4-TCNQ), or the like, and a metal oxide, e.g., a tungsten oxide, a molybdenum oxide, or the like.

The hole transporting layer may include a hole transporting material. The hole transporting material may include, for example, a carbazole-based derivative such as N-phenylcarbazole and polyvinylcarbazole, a fluorine-based derivative, N,N'-bis(3-methylphenyl)-N,N'-diphenyl-[1,1-biphenyl]-4,4'-diamine (TPD), a triphenylamine derivative such as 4,4',4"-tris(N-carbazolyl)triphenylamine) (TCTA), N,N'-di(1-naphthyl)-N,N'diphenylbenzidine (NPB), 4,4'-cyclohexylidene bis[N,N-bis(4-methylphenyl)benzenamine] (TAPC), or the like.

The organic light emitting layer EML is on the hole control layer HTR. The organic light emitting layer EML according to an embodiment may emit blue light. The display device according to an embodiment may be top emission type. Accordingly, the blue light emitted from the organic light emitting layer EML may pass through the second electrode CE, and be incident to the color conversion panel according to an embodiment.

The electron control layer ETR may be provided on the organic light emitting layer EML. The electron control layer ETR may have a structure in which an electron transporting layer and an electron injecting layer are stacked.

The electron transporting layer may include an electron transporting material. The electron transporting material may include, for example, tris (8-hydroxyquinolinato) aluminum ($Alq_3$), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl) anthracene (AND), or the like, or a mixture thereof.

The electron injecting layer may include an electron injecting material. The electron injecting material may include a lanthanum metal, e.g., LiF, lithium quinolate (LiQ), $Li_2O$, BaO, NaCl, CsF, Yb, or the like, or a halogenated metal, e.g. RbCl, RbI or the like. Alternatively, the electron injecting layer may include a mixture of an electron transporting material and an insulating organometallic salt. The organometallic salt may be a substance having an energy band gap of about 4 eV or more. For example, the organometallic salt may include metal acetate, metal benzoate, metal acetoacetate, metal acetylacetonate, metal stearate, or the like.

The second electrode CE is on the organic light emitting layer EML. The second electrode CE may be semi-light transmissive or light transmissive.

When the second electrode CE has semi-light transmitting characteristics, the second electrode CE may include Ag, Mg, Cu, Al, Pt, Pd, Au, Ni, Nd, Ir, Cr, Li, Ca, LiF/Ca, LiF/Al, Mo, Ti, or the like, or a compound or a mixture thereof (e.g., a mixture of Ag and Mg). When the thickness of the second electrode CE is several tens to several hundreds of angstroms, the second electrode CE may have semi-light transmitting characteristics.

When the second electrode CE has light transmitting characteristics, the second electrode CE may include transparent conductive oxide ("TCO"). For example, the second electrode CE may include tungsten oxide ($W_xO_x$), titanium oxide ($TiO_2$), indium tin oxide (ITO), indium zinc oxide (IZO), zinc oxide (ZnO), indium tin zinc oxide (ITZO), magnesium oxide (MgO), or the like.

A thin film encapsulation layer TFE is on the second electrode CE to seal the OLED. Accordingly, a gas or moisture that may be permeated toward the OLED is blocked by the thin film encapsulation layer TFE.

The thin film encapsulation layer TFE may include an organic layer and an inorganic layer stacked on the organic layer. The thin film encapsulation layer TFE may include a first inorganic layer CL1, a first organic layer CL1, and a second inorganic layer CL2 that are sequentially stacked in the thickness direction of the display base substrate 111. Alternatively, the thin film encapsulation layer TFE may include two or more inorganic layers and two or more organic layers that are alternately with the two or more inorganic layers.

The thin film encapsulation layer TFE may reflect light emitted from the color conversion panel using the structure of the first and second inorganic layers CL1 and CL2. As such, the amount of color light used for displaying images by the display device may be increased through the use of the thin film encapsulation layer TFE.

The light blocking pattern 220 of the color conversion panel according to an embodiment may overlap the pixel defining layer PDL on a plane, e.g., along the second direction D2.

The first color conversion layer 241 of the color conversion panel may overlap the first electrode AN, the organic light emitting layer EML, and the second electrode CE along the second direction D2. Specifically, as illustrated in FIG. 20, the first color conversion layer 241 may overlap all of the first electrode AN, the organic light emitting layer EML, and the second electrode CE.

Figure 21:
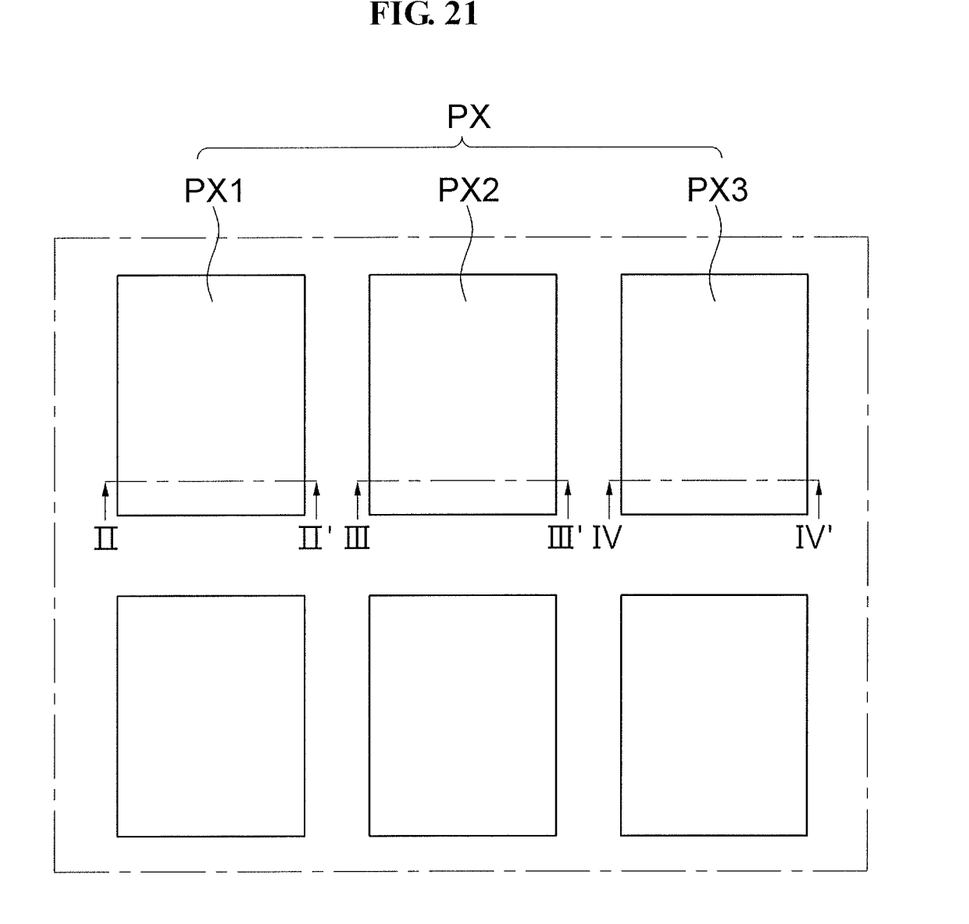
FIG. 21 illustrates a plan view of a display panel according to an embodiment.
Figure 22:
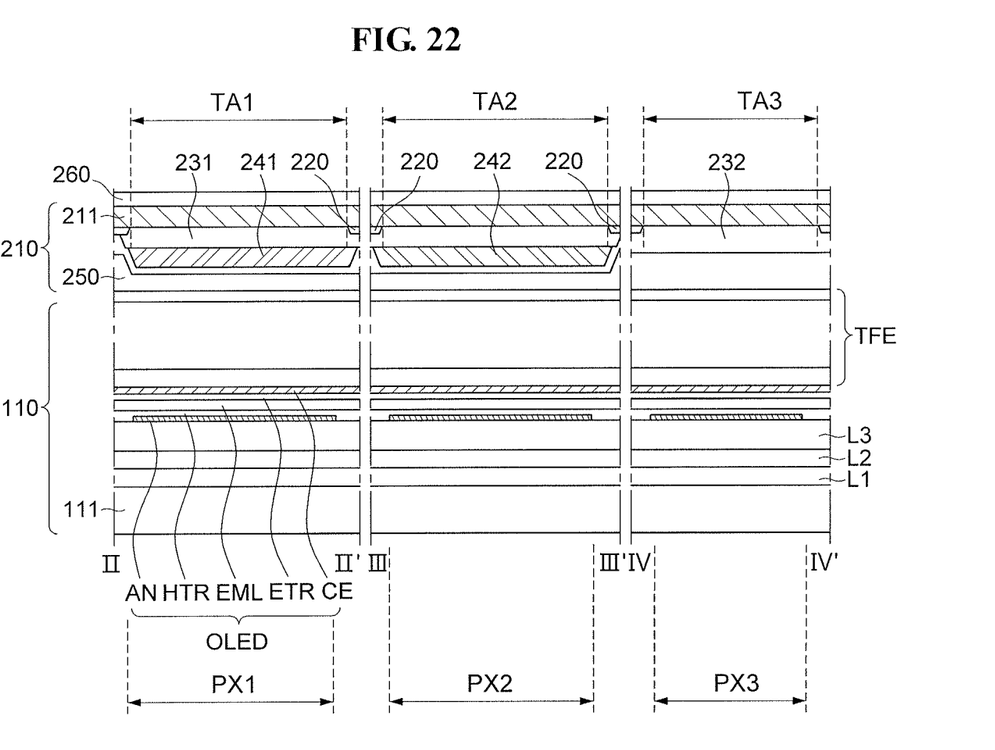
FIG. 22 illustrates a cross-sectional view taken along lines II-II', III-III' and IV-IV' of FIG. 21.

FIG. 21 is a plan view illustrating a display panel according to an embodiment, and FIG. 22 is a cross-sectional view taken along lines III-III' and IV-IV' of FIG. 21.

A pixel PX of the display device according to an exemplary embodiment may include a first pixel PX1, a second pixel PX2, and a third pixel PX3. In such an embodiment, the first pixel PX1 may correspond to a red pixel, the second pixel PX2 may correspond to a green pixel, and the third pixel PX3 may correspond to a blue pixel.

According to an embodiment, the first, second, and third transmissive areas TA1, TA2, and TA3 correspond to the pixels PX1, PX2 and PX3, respectively. Specifically, the first transmissive area TA1 corresponds to the first pixel PX1, the second transmissive area TA2 corresponds to the second pixel PX2, the third transmissive area TA3 corresponds to the third pixel PX3. Each of the first, second, and third pixels PX1, PX2, and PX3 according to an embodiment may include an OLED that emits blue light.

Light emitted from the organic light emitting layer EML is transmitted through the thin film encapsulation layer TFE and is incident to the color conversion panel. Specifically, light incident on the color conversion panel at the first pixel PX1 is sequentially transmitted and converted through the transmissive layer 250, the second color filter 232, the first color conversion layer 241, the first color filter 231, and the yellow light absorbing layer 260 in the first transmissive area TA1. Light incident on the color conversion panel at the second pixel PX2 is sequentially transmitted and converted through the transmissive layer 250, the second color filter 232, the second color conversion layer 242, the first color filter 231, and the yellow light absorbing layer 260 in the second transmissive area TA2. Light incident to the color conversion panel at the third pixel PX3 is sequentially transmitted and converted through the transmissive layer 250, the second color filter 232, and the yellow light absorbing layer 260. That is, the first pixel PX1 may be a red pixel, the second pixel PX2 may be a green pixel, and the third pixel PX3 may be a blue pixel.

As set forth hereinabove, according to one or more embodiments, the color conversion panel and the display device including the color conversion panel may reduce the manufacturing costs by reducing the number of masks used during the manufacturing process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A color conversion panel, comprising:
a color base substrate having a first transmissive area, a second transmissive area, and a third transmissive area;
a light blocking pattern on the color base substrate and defining the first transmissive area, the second transmissive area, and the third transmissive area;
a first color filter in the first transmissive area and the second transmissive area;
a first color conversion layer on the first color filter in the first transmissive area;
a second color conversion layer on the first color filter in the second transmissive area; and
a second color filter in the first transmissive area, the second transmissive area, and the third transmissive area,
wherein the first color conversion layer and the second color conversion layer are each between the first color filter and the second color filter.

2. The color conversion panel as claimed in claim 1, wherein the first color filter includes a yellow dye and a gray dye.

3. The color conversion panel as claimed in claim 1, wherein the second color filter is over an entire surface of the color base substrate.

4. The color conversion panel as claimed in claim 1, wherein a height of the second color filter is different in the first transmissive area and the third transmissive area.

5. The color conversion panel as claimed in claim 1, wherein the second color filter has substantially a same height in the first transmissive area, the second transmissive area, and the third transmissive area.

6. The color conversion panel as claimed in claim 1, further comprising a transmissive layer on the second color filter.

7. The color conversion panel as claimed in claim 6, wherein the transmissive layer includes a scattering element.

8. The color conversion panel as claimed in claim 6, wherein a thickness of the transmissive layer is different in the first transmissive area, the second transmissive area, and the third transmissive area.

9. The color conversion panel as claimed in claim 6, wherein the transmissive layer has substantially a same thickness in the first transmissive area, the second transmissive area, and the third transmissive area.

10. The color conversion panel as claimed in claim 1, further comprising a yellow light absorbing layer on a surface of the color base substrate.

11. The color conversion panel as claimed in claim 10, wherein the yellow light absorbing layer is between the color base substrate and the second color filter.

12. The color conversion panel as claimed in claim 1, wherein:
   the first color conversion layer includes red quantum dots or red quantum rods, and
   the second color conversion layer includes green quantum dots or green quantum rods.

13. The display device as claimed in claim 1, wherein a color of the first color filter is different from a color of the second color filter.

14. A display device, comprising:
   a display panel including a plurality of pixels; and
   a color conversion panel having a first transmissive area, a second transmissive area, and a third transmissive area;
   wherein the color conversion panel includes:
      a color base substrate;
      a light blocking pattern on the color base substrate and defining the first transmissive area, the second transmissive area, and the third transmissive area;
      a first color filter in the first transmissive area and the second transmissive area;
      a first color conversion layer on the first color filter in the first transmissive area;
      a second color conversion layer on the first color filter in the second transmissive area; and
      a second color filter in the first transmissive area, the second transmissive area, and the third transmissive area, wherein:
         each pixel includes an organic light emitting element having a first electrode, an organic light emitting layer, and a second electrode, and is in one of the first to third transmissive areas,
         the first color conversion layer and the second color conversion layer are each between the first color filter and the second color filter,
         the first color conversion layer overlaps the first electrode, the organic light emitting layer, and the second electrode in the first transmissive area, and
         the second color conversion layer overlaps the first electrode, the organic light emitting layer, and the second electrode in the second transmissive area.

15. The display device as claimed in claim 14, wherein the first color filter includes a yellow dye and a gray dye.

16. The display device as claimed in claim 14, wherein the second color filter is disposed over the entire surface of the color base substrate.

17. The display device as claimed in claim 14, further comprising a transmissive layer on the second color filter.

18. The display device as claimed in claim 17, wherein the transmissive layer includes a scattering element.

19. The display device as claimed in claim 14, further comprising a yellow light absorbing layer on a surface of the color base substrate.

20. The display device as claimed in claim 19, wherein the yellow light absorbing layer is between the color base substrate and the second color filter.

21. The display device as claimed in claim 14, wherein:
   the first color conversion layer includes red quantum dots or red quantum rods, and
   the second color conversion layer includes green quantum dots or green quantum rods.

* * * * *